US007928545B2

(12) United States Patent
Kwon et al.

(10) Patent No.: US 7,928,545 B2
(45) Date of Patent: Apr. 19, 2011

(54) LED PACKAGE AND FABRICATION METHOD THEREOF

(75) Inventors: Ki-hwan Kwon, Suwon-si (KR); Kyu-ho Shin, Seoul (KR); Soon-cheol Kweon, Seoul (KR); Chang-youl Moon, Suwon-si (KR); Arthur Darbinian, Suwon-si (KR); Seung-tae Choi, Suwon-si (KR); Su-ho Shin, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 551 days.

(21) Appl. No.: 11/416,107

(22) Filed: May 3, 2006

(65) Prior Publication Data
US 2007/0039164 A1    Feb. 22, 2007

(30) Foreign Application Priority Data
Aug. 8, 2005    (KR) .......................... 10-2005-0072261

(51) Int. Cl.
*H01L 23/495*    (2006.01)
(52) U.S. Cl. .............. 257/676; 257/13; 257/79; 257/81; 257/91; 257/690; 257/685; 257/704; 257/708; 257/710
(58) Field of Classification Search .................... 257/99, 257/100, 678, 680, 433, 434, 98, 692, 693, 257/696, 706, E33.066, E23.031, E23.039, 257/E23.043, E23.056, 666, 672, 676, 690, 257/E51.018, 13, 79, 81, 686, 704, 708, 710
See application file for complete search history.

(56) References Cited

U.S. PATENT DOCUMENTS

| 5,689,796 | A | 11/1997 | Kasai et al. |
| 7,087,465 | B2 * | 8/2006 | Collins, III .................... 438/115 |
| 7,208,772 | B2 * | 4/2007 | Lee et al. ......................... 257/99 |
| 7,332,802 | B2 * | 2/2008 | Konno ........................... 257/690 |
| 2003/0039571 | A1 | 2/2003 | Lim |
| 2004/0075100 | A1* | 4/2004 | Bogner et al. ................... 257/99 |
| 2004/0126913 | A1* | 7/2004 | Loh ................................. 438/26 |
| 2004/0227146 | A1 | 11/2004 | Wu |
| 2005/0093116 | A1 | 5/2005 | Palmteer et al. |

(Continued)

FOREIGN PATENT DOCUMENTS
DE    10305021 A1    4/2004
(Continued)

OTHER PUBLICATIONS

European Search Report issued on Aug. 17, 2010 in the corresponding European Patent Application No. 06013382.4.

(Continued)

*Primary Examiner* — Thao X Le
*Assistant Examiner* — Thanh Y Tran
(74) *Attorney, Agent, or Firm* — Sughrue Mion, PLLC (57) ABSTRACT

An LED package and a fabrication method thereof are provided. The LED package includes an upper metal plate having an LED-receiving hole therein; a lower metal plate disposed under the upper metal plate; and an insulator which the upper metal plate and the lower metal plate from each other. A portion of the lower metal plate is exposed via the LED-receiving hole and an LED is mounted on the exposed portion of the lower metal plate and is electrically connected to both of the upper and lower metal plates. A protective cover encloses and protects exposed surfaces of the upper and lower metal plates.

13 Claims, 12 Drawing Sheets

U.S. PATENT DOCUMENTS

| | | |
|---|---|---|
| 2005/0161771 A1 | 6/2005 | Suehiro et al. |
| 2005/0280019 A1 | 12/2005 | Konno |
| 2006/0108669 A1* | 5/2006 | Matsumoto et al. ........ 257/666 |
| 2006/0133044 A1* | 6/2006 | Kim et al. .................. 361/704 |
| 2006/0261364 A1* | 11/2006 | Suehiro et al. ............. 257/100 |
| 2007/0030703 A1* | 2/2007 | Lee et al. ................... 362/800 |
| 2007/0181901 A1* | 8/2007 | Loh ............................. 257/99 |

FOREIGN PATENT DOCUMENTS

| | | |
|---|---|---|
| EP | 1087447 A1 | 3/2001 |
| JP | 2003-318448 A | 11/2003 |
| JP | 2004-152993 A | 5/2004 |
| JP | 2004-200207 A | 7/2004 |
| JP | 2004-228240 A | 12/2004 |
| JP | 2005-167086 A | 6/2005 |
| WO | 2004/001862 A1 | 12/2003 |
| WO | 2004082036 A1 | 9/2004 |

OTHER PUBLICATIONS

Japanese Office Action issued Jul. 13, 2010 in the corresponding Japanese Patent Application No. 2006-214874.

* cited by examiner

LED PACKAGE AND FABRICATION METHOD THEREOF

CROSS-REFERENCE TO RELATED APPLICATIONS

This application claims priority under 35 U.S.C. §119(a) of Korean Patent Application No. 2005-72261, filed Aug. 8, 2005, the entire contents of which are incorporated herein by reference.

BACKGROUND OF THE INVENTION

1. Field of the Invention

Methods and apparatuses consistent with the present invention relate to a package of a light emitting diode (LED) used for generally backlight units of liquid crystal displays (LCD) and lightings and a fabrication method thereof.

2. Description of the Related Art

Since LEDs have many advantages such as a long life span and low power consumption, they are being used in a variety of fields including electronics and advertising. Recently, there have been attempts to use LEDs as backlight units in LCD devices, and it is expected that the use of LEDs in indoor and outdoor lighting systems will become wide spread. There is an increasing demand for LED packages with a small size and which can efficiently dissipate heat.

LEDs used in backlight units for LCDs or in lighting apparatuses require high power consumption. However, when the temperature rises, the performance of LEDs exponentially decays. Therefore, thermal management of LED packages is important.

Figure 1:
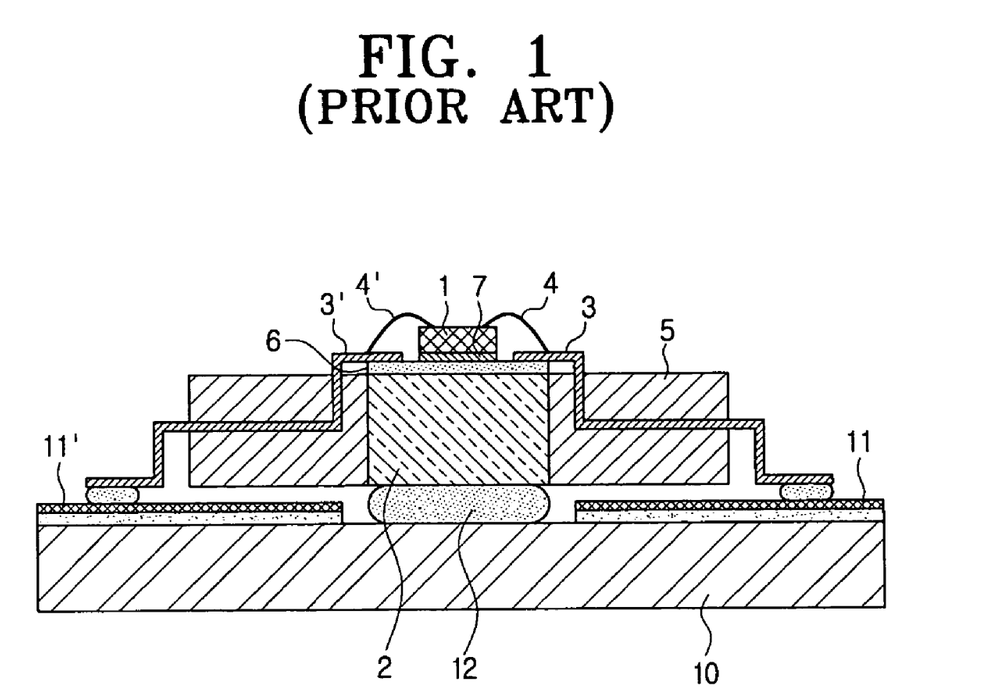
FIG. 1 is a cross-sectional view of a conventional LED package.

FIG. 1 illustrates a cross-sectional view of a conventional LED package. As illustrated in FIG. 1, the LED package includes an LED 1, a heat sink member 2 on which the LED 1 is disposed, leads 3 and 3', wires 4 and 4' for electrically connecting the LED 1 to the leads 3 and 3', and a body 5 for enclosing the heat sink member 2 and the leads 3 and 3' therein.

The heat sink member 2 is exposed on the bottom surface thereof and is covered with an insulating layer 6 on the top surface thereof. The LED 1 is bonded at the center portion of the insulating layer 6 by an adhesive 7 and first ends of each of the leads 3 and 3' are arranged on the sides of the insulation layer 6. The second ends of the leads 3 and 3' project from the sides of the body 5 and are exposed. The wires 4 and 4' connect the LED 1 to the first ends of the leads 3 and 3'. A cap (not shown) can be disposed on the top of the body 5 for sealing the LED 1.

The conventional LED package as described above is mounted on a board 10 such that the second ends of the leads 3 and 3' are soldered to pads 11 and 11', respectively, provided on the board 10. Further, since solder 12 is disposed between the heat sink member 2 of the LED package and the board 10, heat generated by the LED 1 can be released via the heat sink member 2, the solder 12 and the board 10.

However, conventional LED packages, such as shown in FIG. 1, have long heat transfer paths (e.g: LED→insulating layer→heat sinking member→solder→board). Further, since the heat transfer path includes many different materials, the heat sinking capability decreases due to an increase in thermal resistance. Accordingly, a conventional LED package such as described above is not suitable for high power LEDs.

Thermal resistance Rth is expressed by the following equation: $Rth = L/(k*A)$. According to this equation, the thermal resistance Rth decreases as thickness becomes smaller, that is, the heat transfer path L becomes shorter, and the heat transmittance k and the heat sinking area A become larger. However, since a conventional LED has contacts formed between different materials and the heat transfer path L is long, thermal resistance is high in a conventional LED package.

When heat dissipation performance of an LED package is not good, the life span of the LED may be reduced and fatal damage may be caused to the system employing the LED package because the peripheral parts of the system may deteriorated or be thermally deformed.

Further, since the parts of a conventional LED package (e.g. the package body, the leads, and the pads) are formed separately, a method of fabricating the LED package and the structure of the LED package are complicated.

SUMMARY OF THE INVENTION

According to one exemplary embodiment of the present invention, there is provided an LED package including an upper metal plate having an LED-receiving hole, and a lower metal plate mounted to a lower surface of the upper metal plate via an insulator disposed therebetween. A portion of the lower metal plate is exposed via the LED-receiving hole in the upper metal plate. An LED is mounted on the exposed portion of the lower metal plate and electrically connected to the upper and lower metal plates A protective cover encloses and protects exposed surfaces of the upper and lower metal plates.

A lead extends from at least one of the upper metal plate and the lower metal plate, and the lead forms an integrated single body with the metal plate from which it extends.

The lead may extend and project through the protective cover.

The LED package may further include a lens mounted on the upper metal plate.

In the LED package, a lens attachment unit may be provided on the protective cover.

The upper and lower metal plates may be made of aluminum (Al) or copper (Cu).

In the LED package, an inner circumference of the LED receiving hole may become larger from the lower surface to an upper surface of the upper metal plate, and a reflective coating layer may be formed on an inner circumferential surface of the LED receiving hole.

The insulator may have a penetration hole therein in a position corresponding to the position of the LED receiving hole. The insulator may be an adhesive insulator which adheres the upper and lower metal plates together.

The insulator may comprise a polymer film.

The insulator may be made of a plastic material.

The insulator may be formed by injecting a plastic mold material into a gap between the upper and lower metal plates.

The insulator and the protective cover may be formed as an integrated single body.

The insulator and the protective cover may be formed by a plastic molding method.

The LED may be electrically connected to the lower metal plate by solder and electrically connected to the upper metal plate by a wire.

The LED may be coupled to the lower metal plate by bonding and may be electrically connected to the upper metal plate and the lower metal plate by conductive wires.

The LED package above may further include a sub-mount, wherein the sub mount is mounted on the exposed portion of the lower metal plate and the LED is mounted on the sub-mount. The sub-mount has a first electrode and a second electrode which are connected to the LED by solder and further electrically connected to the lower and upper metal plates, respectively by conductive wires.

According to another exemplary embodiment of the present invention, there is provided a method of fabricating an LED package, including: providing an upper metal plate having an LED receiving hole therein; and providing a lower metal plate. An inner circumferential surface of the LED-receiving hole is reflective. The method further includes: affixing the upper and lower metal plates to each other via an insulation layer; mounting an LED on the lower metal plate; electrically connecting the LED to the upper and lower metal plates; enclosing the upper and lower metal plates with a protective cover; and installing a lens over the LED.

The upper metal plate may have a first lead which extends therefrom and which is integrated into a single body together with the upper metal plate.

The lower metal plate may have a second lead which extends therefrom and which is integrated into a single body together with the lower metal plate.

The upper metal plate and the lower metal plate may be formed by injection-molding a metal material.

The step of affixing the plates via an insulation layer may include preparing an insulating adhesive, having a hole therein in a position corresponding to the position of the LED receiving hole, placing the insulating adhesive between the lower metal plate and the upper metal plate; and tightly adhering the lower and upper metal plates to each other.

The insulating adhesive may comprise an adhesive polymer.

The protective cover may be formed by plastic extruding, and the lens may be formed by plastic extruding.

The protective cover and the lens may be formed in an integrated single body by plastic extruding.

According to another exemplary embodiment of the present invention, there is provided a method for fabricating an LED package, including providing an upper metal plate having an LED-receiving hole and providing a lower metal plate. An inner circumferential surface of the LED-receiving hole is reflective. The method further comprises affixing the upper metal plate to the lower metal plate such that the upper and the lower metal plates are insulated from each other and such that the exteriors of the two metal plates are insulated from the outside; mounting an LED on the lower metal plate; electrically connecting the Led to the upper and lower metal plates; and installing a lens over the LED.

The upper metal plate may have a first lead extending therefrom and forming an integrated single body therewith.

The lower metal plate may have a second lead extending therefrom and forming an integrated single body therewith.

The upper and the lower metal plates may be formed by injection-molding a metal material.

The step of affixing the upper metal plate to the lower metal plate may include positioning the upper and lower metal plates to face each other with a gap therebetween; filling the gap between the upper and lower metal plates with an insulating material; and enclosing the upper and lower metal plates with an insulating material, thereby forming a protective cover.

The steps of filling the gap with insulating material and enclosing the upper and lower metal plates may be simultaneously performed by a plastic molding process.

The protective cover may have a lens attachment unit to which the lens is mounted.

According to another exemplary embodiment of the present invention, there is provided a method for fabricating an LED package, including: providing a plurality of upper metal plates, each having an LED receiving hole therein, in an upper substrate made of a metal material; providing a plurality of lower metal plates in a lower substrate made of a metal material; adhering the upper metal plates to corresponding lower metal plates such that the plurality of upper metal plates are insulated from the plurality of lower metal plates; mounting a plurality of LEDs on the lower metal plates such that each LED is electrically connected to an upper metal plate and to a lower metal plates; enclosing the upper and lower metal plates with a protective cover; and installing a plurality of lenses over the LEDs. The upper and lower substrates may be cut such that the portions of the upper and lower substrates connecting the upper and lower metal plates are cut, thereby forming a plurality of LED packages.

Each of the plurality of upper metal plates may include a lead extending therefrom and forming an integrated single body therewith. Each of the plurality of lower metal plates may include a lead extending therefrom and forming an integrated single body therewith.

The step of adhering the upper metal plates to the lower metal plates may include preparing an insulator having a shape corresponding to that of the upper and lower metal plates and having a hole therein at a position corresponding to the position of the LED receiving hole; disposing the insulator between the upper and lower substrates; and pressing the upper and lower metal plates, thereby adhering them to each other.

The step of enclosing the upper and lower metal plates may include forming the protective cover by plastic extruding, and forming the lens by plastic extruding.

The protective cover and the lens may be simultaneously formed as an integrated single body.

According to another exemplary embodiment of the present invention, there is provided a method for fabricating an LED package, including: providing a plurality of upper metal plates, each having an LED receiving hole therein, in an upper substrate made of a metal material; providing a plurality of lower metal plates in a lower substrate made of a metal material and providing them under the upper metal plates; affixing the upper metal plates to corresponding lower metal plates; insulating the upper metal plates from the lower metal plates; insulating the exposed portions of the upper and lower metal plates from the outside; mounting a plurality of LEDs on the lower metal plates such that each LED is electrically connected to an upper metal plate and to a lower metal plates; installing a plurality of lenses over the LEDs; and cutting parts the upper and lower substrates thereby forming a plurality of LED packages.

Each of the plurality of upper metal plates may include a lead extending therefrom and forming an integrated single body therewith. Each of the plurality of lower metal plates may include a lead extending therefrom and forming an integrated single body therewith.

The step of affixing the upper metal plates to the lower metal plates may include positioning the upper metal plates and the lower metal plates to face each other with a gap there between; filling the gap with an insulating material; and enclosing the upper and lower metal plates, thereby forming a protective cover.

The steps of filling the gap and enclosing the upper and lower metal plates may be simultaneously performed by plastic molding.

BRIEF DESCRIPTION OF THE DRAWINGS

The above and other exemplary aspects and of the present invention will become more apparent from the following detailed description of exemplary embodiments thereof with reference to the attached drawing figures, wherein.

DETAILED DESCRIPTION OF EXEMPLARY EMBODIMENTS OF THE INVENTION

Hereinafter, LED packages according to exemplary embodiments of the present invention will be described in detail with reference to the accompanying drawing figures. In explaining the embodiments of the present invention, detailed descriptions of related known functions and configurations will be omitted.

Figure 2:
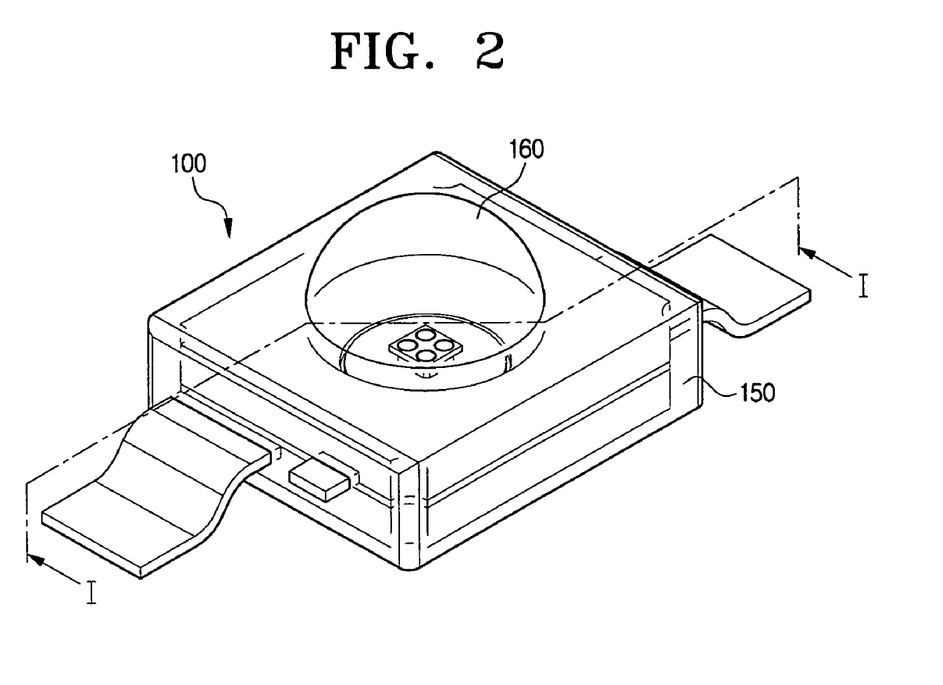
FIG. 2 is a perspective view of an LED package according to a first exemplary embodiment of the present invention.
Figure 3:
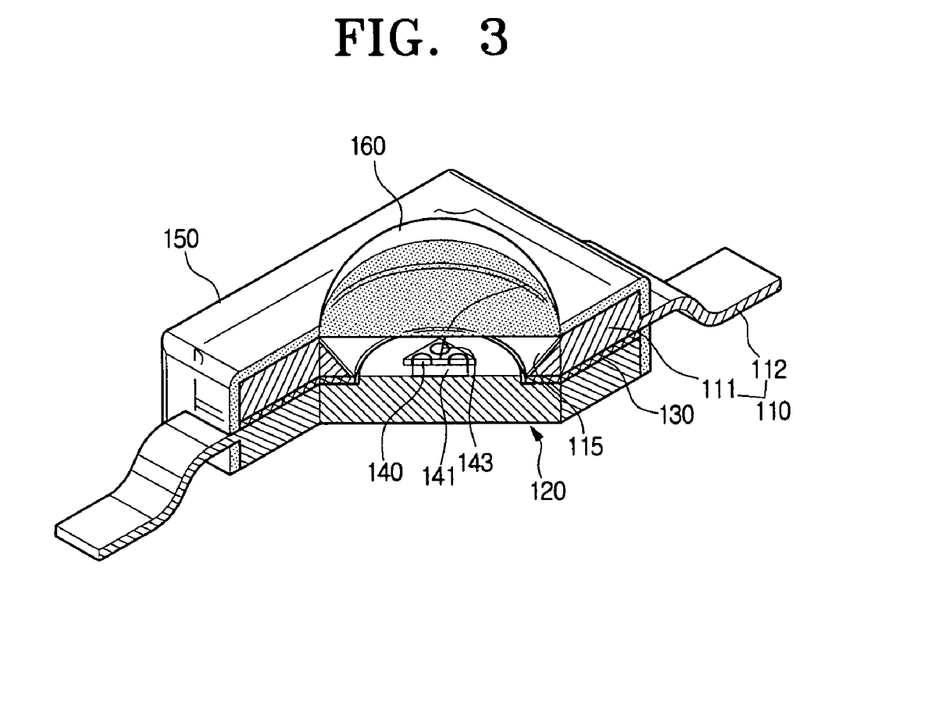
FIG. 3 is a cross-sectional view taken along line II-II shown in FIG. 2.

Referring to FIG. 2 and FIG. 3, an LED package 100 according to the first exemplary embodiment of the present invention includes an upper metal plate 110, a lower metal plate 120, an insulator 130 disposed between the upper metal plate 110 and the lower metal plate 120, an LED 140, and a protective cover 150.

Figure 4A:
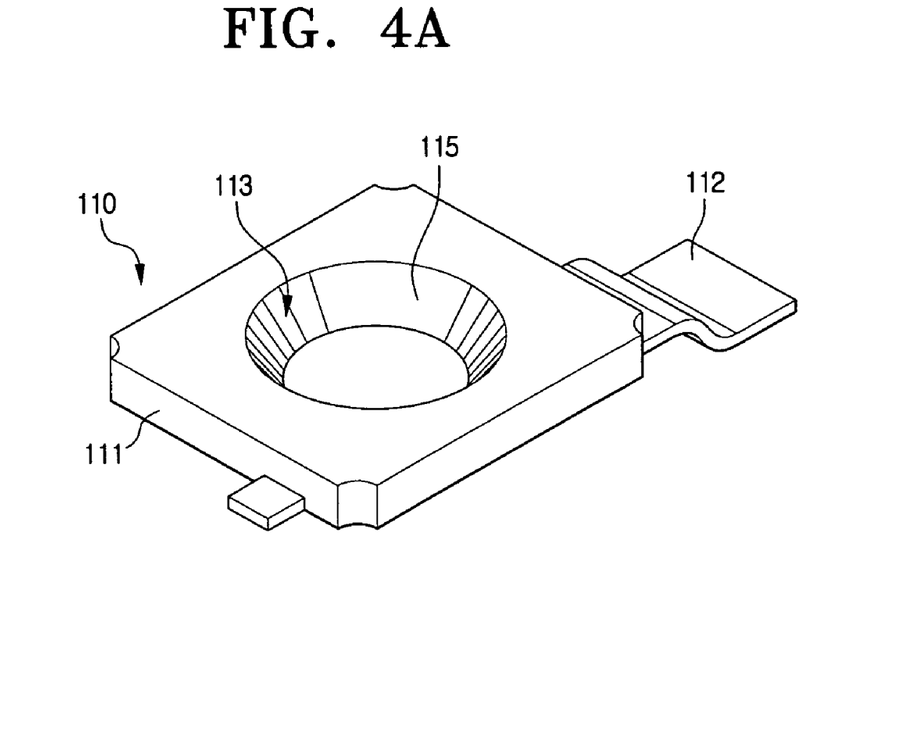
FIG. 4A is a perspective view of an upper metal plate shown in FIG. 3.

The upper metal plate 110 has a thin film structure made of a metal material such as aluminum (Al) or copper (Cu). As illustrated in FIG. 4A, the upper metal plate 110 has a body 111 with a plate-like shape and a first lead 112 extending from a side of the body 111. The first lead 112 and the body 111 are a single piece with a predetermined length. The first lead 112 can bent into a curve shape by external force. When the LED package is installed on a board, the first lead 112 can be electrically connected to an electrode pad provided on the board.

The upper metal plate 110 also has an LED-receiving hole 113 through which an LED 140 can be installed. The LED receiving-hole 113 penetrates the body 111 of the upper metal plate 110 and its inner circumferential length increases from a lower surface to an upper surface of the upper metal plate 110. A coating layer 115 made of a metal may be coated on the inner circumferential surface of the LED receiving-hole 113 to enhance the light reflectance. The coating layer 115 may be formed by plating silver (Ag) or Nickel.

Figure 4B:
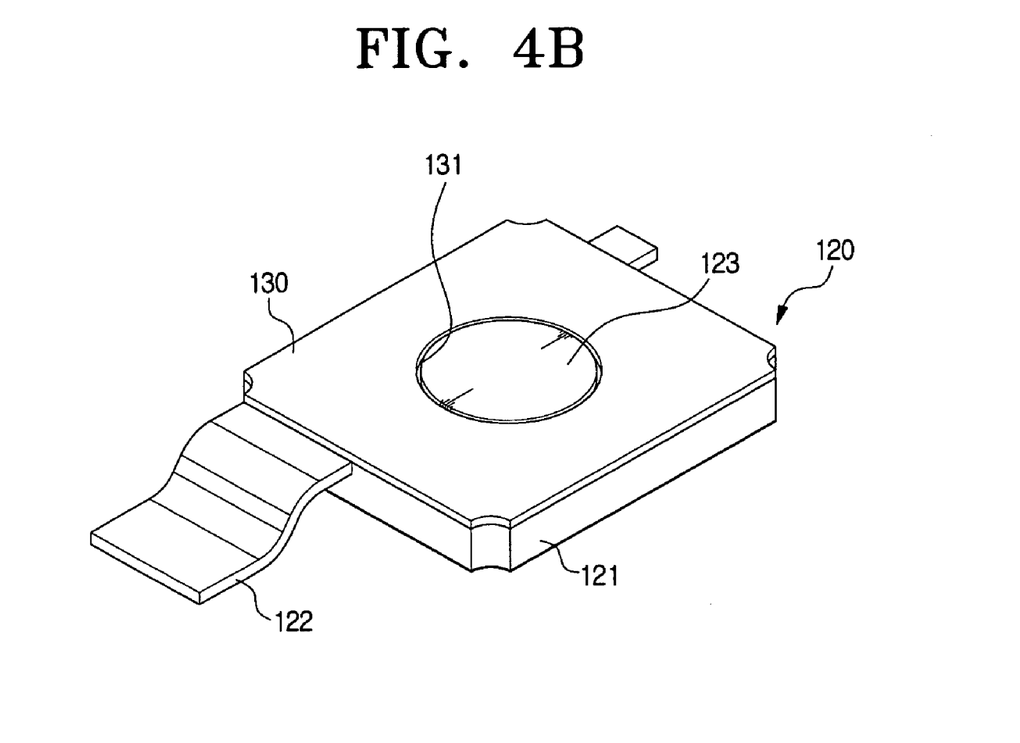
FIG. 4B is a perspective view of a lower metal plate shown in FIG. 3.

The lower metal plate 120 is attached to the upper metal substrate 110 via the insulator 130 disposed therebetween. The shape of the lower metal plate 120 corresponds to that of the upper metal plate 110. Referring to FIG. 4B, the lower metal plate 120 includes a body 121 and a second lead 122 extending from a side of the body 121. The lower metal plate 120 has an LED support 123 which projects upward from the upper surface thereof and is located at a position corresponding to the LED-receiving hole 113 of the upper metal plate 110. The LED 140 is mounted on the LED support 123.

The lower metal plate 120 is made of the same material as the upper metal plate 110. When the LED package 100 is mounted on a board, the second lead 122, like the first lead 112, is connected to an electrode pad formed on the board.

The insulator 130 is disposed between the upper and lower metal plates 110 and 120 for insulating them from each other. The insulator 130 may be an adherent polymer film. The insulator 130 has a hole 131 therein, in a position corresponding to that of the LED-receiving hole 113 so that the LED support 123 of the lower metal plate 120 is exposed through the LED receiving-hole 113.

The LED 140 is electrically bonded to the surface of the LED support 123 via solder 141 and is electrically connected to the upper metal plate 110 via a conductive wire 143.

The protective cover 150 encapsulates the exterior of the upper and lower metal plates 110 and 120. The protective cover 150 may be formed by plastic-molding such that it encloses the upper and lower metal plates 110 and 120 but does not enclose the first and second leads 112 and 122. The bottom surface of the lower metal plate 120 is not covered by the protective layer 150. The bottom of the lower metal plate 120 can be directly bonded to a board and can be electrically connected to electrode pads provided on the board.

The LED 140 is covered by a lens 160 to guide light emitted from the LED 140 in a predetermined direction. The lens 160 may be made of a plastic material and can be formed by a molding method in an integrated single body together with the protective layer 150.

In an LED package 100 having the configuration described above, since the LED 140 is directly in contact with the lower metal plate 120, heat generated in the LED 140 can be efficiently transferred to the lower metal plate 120. Also, since the lower metal plate 120 is thin and broad, thermal resistance is reduced due to the large heat-sink area, and thus the heat dissipation performance is enhanced.

Further, since the upper and lower metal plates 110 and 120 serve as electrodes of the LED 140, additional electrodes are not needed. As a result, the LED package has a simple structure. Accordingly, fabrication processes and assembling processes of the LED package are simplified. Because the metal plates 110 and the first lead 112 and the mental plate 120 and the second lead 122 are formed as integrated bodies, respectively, the number of parts of the LED package is reduced and thus the fabrication and the assembly of the LED package are simplified.

Since the upper metal plate 110 is made of metal, the surface of its body 111 can function as a light reflection layer. Accordingly, it is possible to enhance the light reflectance.

Hereinafter, a method for fabricating an LED package according to the first embodiment of the present invention will be described. A large-volume fabrication method of the LED package 100 is exemplified in this embodiment.

Figure 5A:
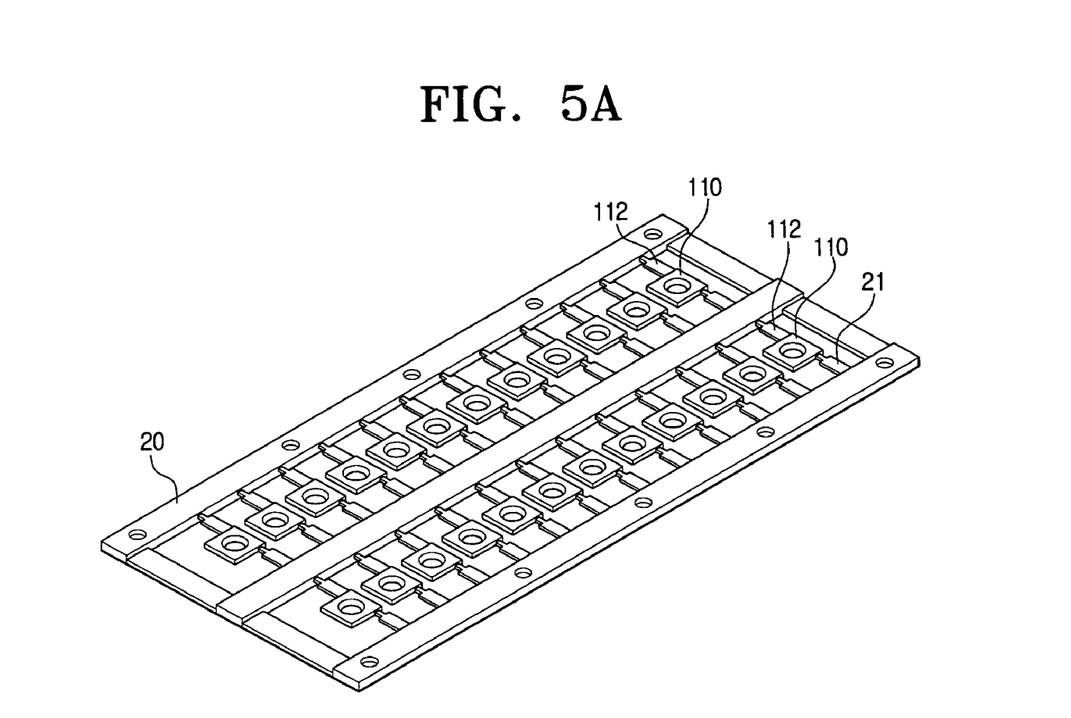
FIG. 5A to FIG. 5D are schematic views of a fabrication method of the LED package according to the first exemplary embodiment of the present invention.

First, as illustrated in FIG. 5A, a plurality of upper metal plates 110 are formed by processing an upper metal substrate 20. The number of upper metal plates 110 formed by one metal substrate 20 may be predetermined. The upper metal plates 110 are coupled to a connection part 21 of the metal substrate 20 by the portions of the upper metal plates 110 which will later become the leads 112. Later, the connection parts 21 may be removed by cutting. The upper metal plates 110 may be formed by injection-molding.

Figure 5B:
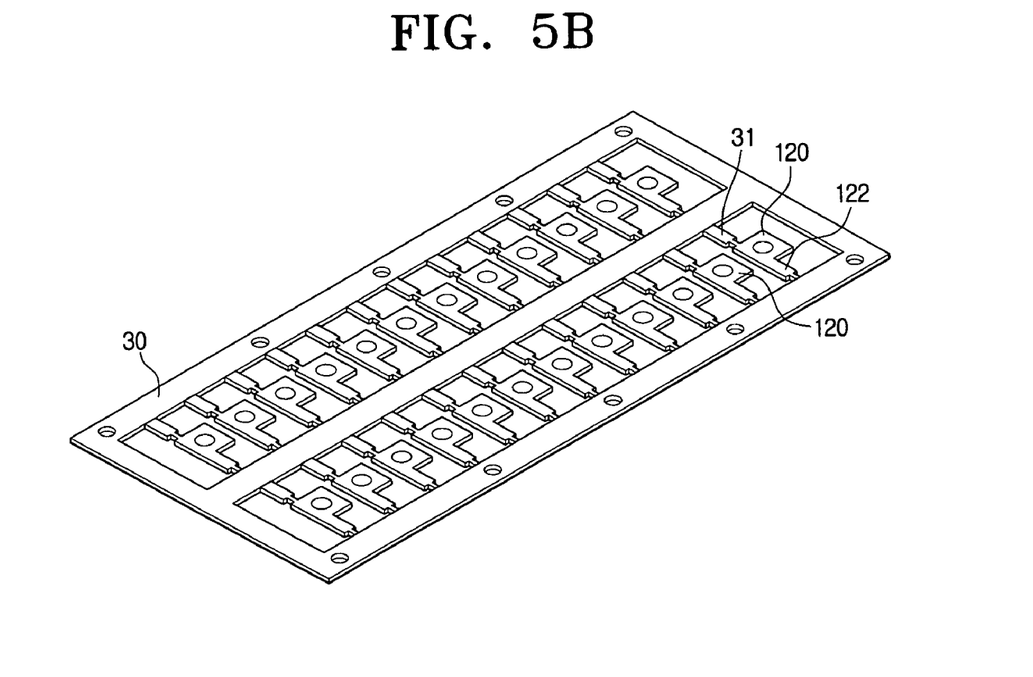

Next, referring to FIG. 5B, a plurality of lower metal plates 120 is formed by processing a lower substrate 30. The plurality of lower metal plates correspond to the plurality of upper metal plates 110 in position and size. The lower substrate 30 is also made of metal and may be formed by injection-molding. The lower metal plates 120 can be coupled to connection parts 31 of the lower substrate 30 by the leads 122. The number and positions of the upper metal plates 110 provided by the upper substrate 20 are identical to those of the lower metal plates 120 made from the lower substrate 30.

Figure 5C:
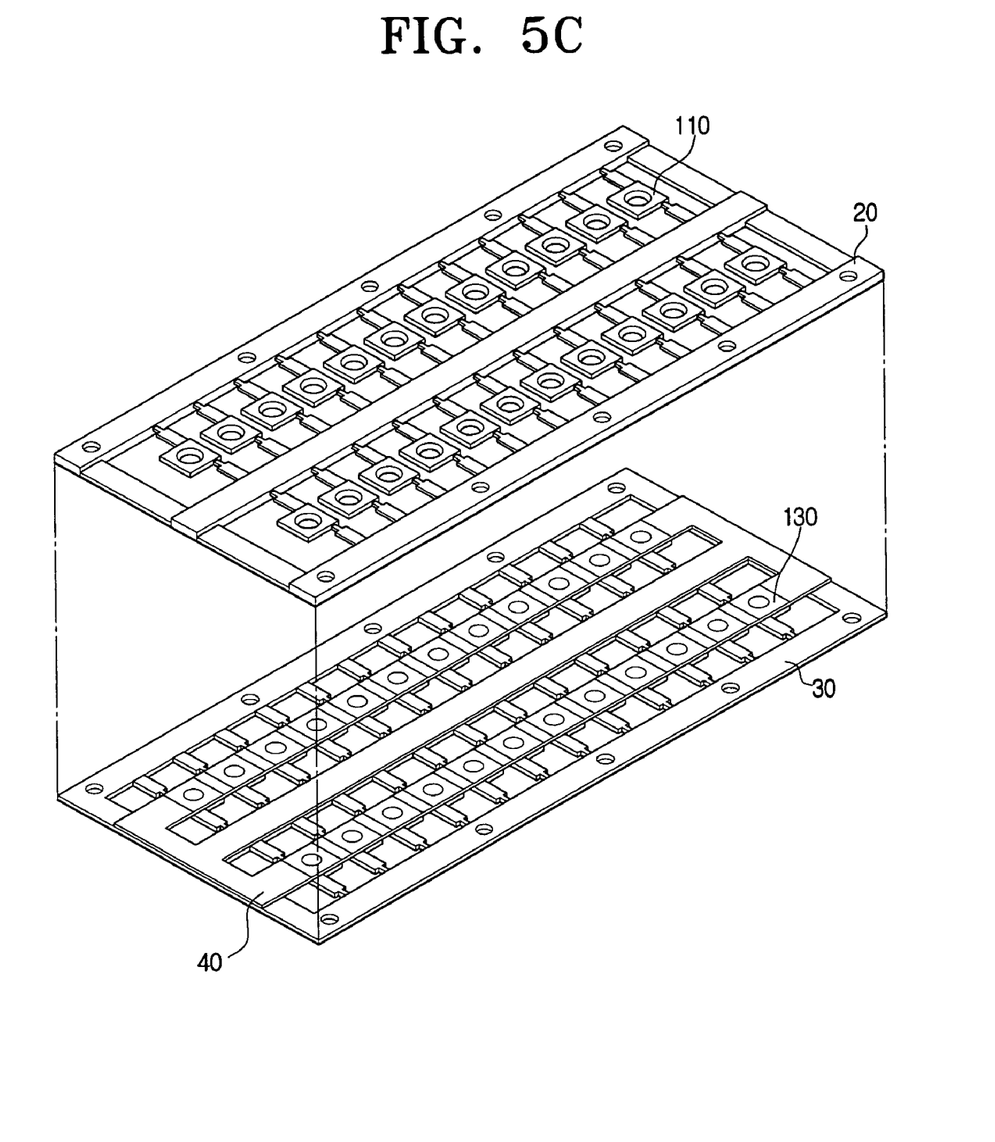

Next, as shown in FIG. 5C, the substrates 20 and 30 are positioned to face each other, and an insulating film 40, serving as the insulator 130, is disposed between the substrates 20 and 30. In order to construct a substrate assembly in which an insulating film 40 is sandwiched by the substrates 20 and 30, the insulating film 40 may first be adhered onto the lower substrate 30, then the upper substrate 20 may be disposed onto the insulating film 40, and then the stacked structure may be pressed. As a result, as shown in FIG. 5D, a substrate assembly 50, in which two substrates 20 and 30 are combined, is prepared.

After preparation of the substrate assembly 50, the LEDs 140 are mounted on the corresponding lower metal plates 120, such that the LEDs 140 are electrically connected to corresponding upper metal plates 110 and the lower metal plates 120 which face each other. That is, referring to FIG. 3, each LED 140 is connected to a corresponding lower metal plate 110 via a piece of solder 141 and is connected to a corresponding upper metal plate 110 via a wire 143.

Figure 5D:
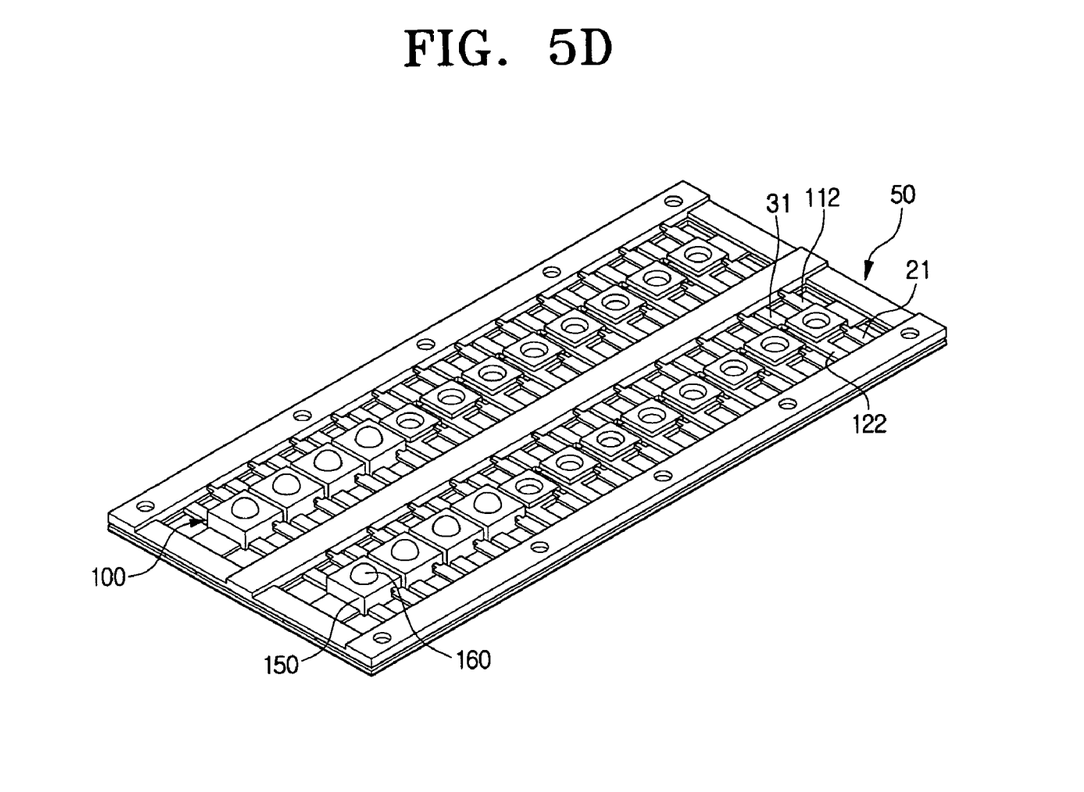

Next, as illustrated in FIG. 5D, the exterior of the package is enclosed by the protective cover 150 and the lens 160, which are formed by plastic extruding. As a result, the exterior of the LED package is molded by a plastic mold and is insulated from the outside. The lens 160 and the protective cover 150 are formed as an integrated single body. Accordingly, the upper metal plate 110 and the lower metal plate 120 are securely combined.

Finally, the connection parts 21 and 31 and the leads 112 and 122, which are exposed to the outside of the protective cover 150, are cut, and thus a plurality of LED packages, as shown in FIG. 2 and FIG. 3, is produced.

Figure 6:
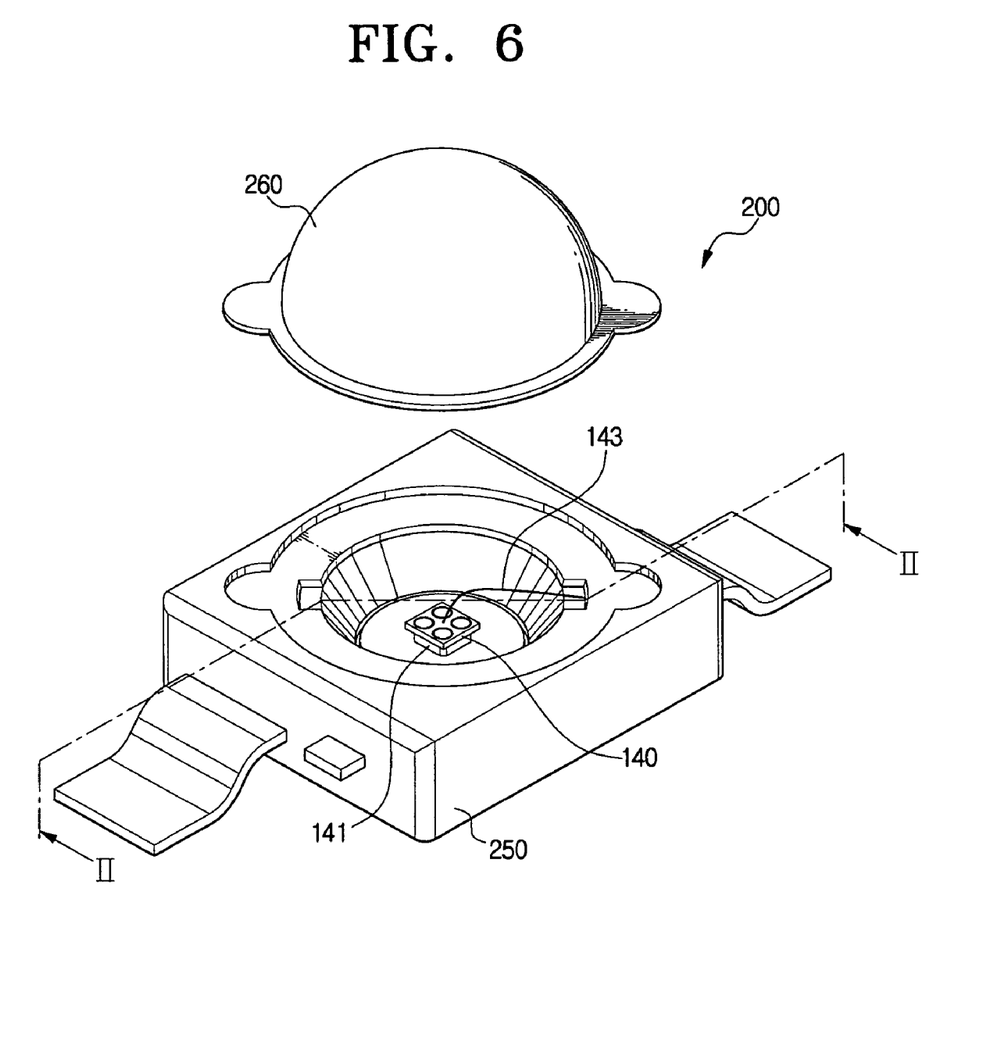
FIG. 6 is an exploded perspective view of an LED package according to a second exemplary embodiment of the present invention.
Figure 7:
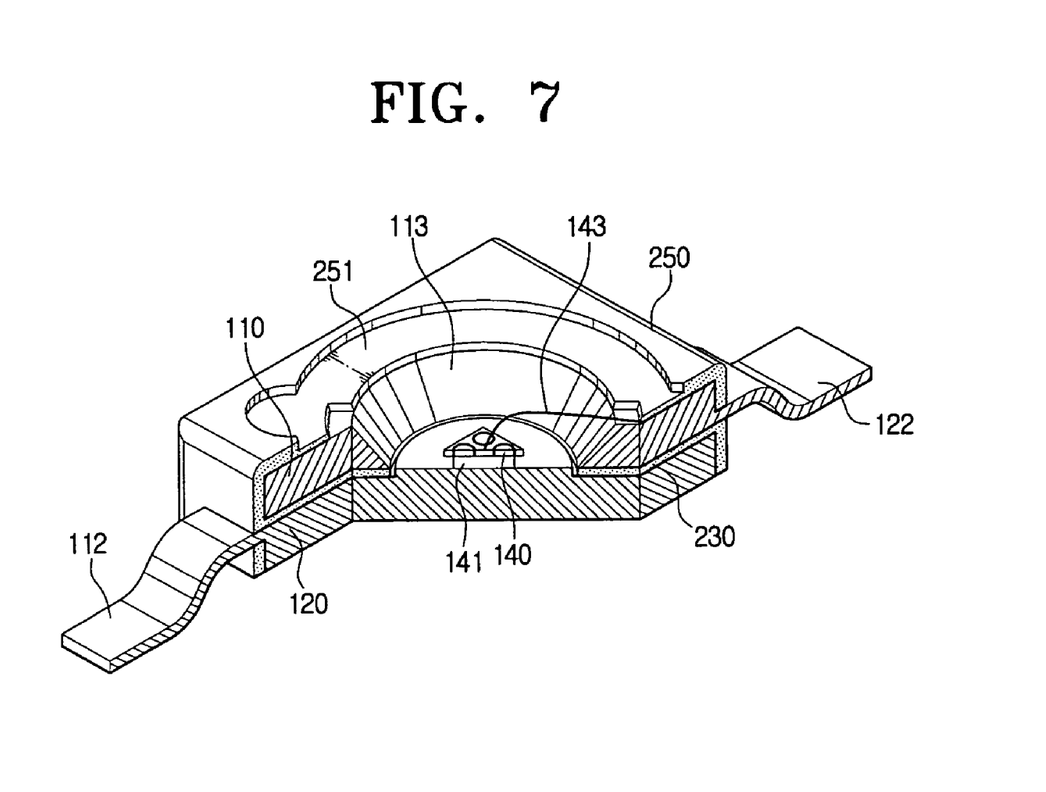
FIG. 7 is a cross-sectional view taken along line VII-VII shown in FIG. 6.

Referring to FIG. 6 and FIG. 7, an LED package 200 according to the second exemplary embodiment of the present invention includes an upper metal plate 110, a lower metal plate 120, an LED 140, an insulator 230, for insulating the upper metal plate 110 and the lower metal plate 120 from each other, a protective cover 250, and a lens 260, for enclosing the exterior of the upper and lower metal plates 110 and 120.

In explaining elements of the LED package 200 according to the second exemplary embodiment illustrated in FIG. 6 and FIG. 7, like elements in the LED package 100 and the LED package 200 are denoted by like reference numerals and will not be described repeatedly.

The insulator 230 is made of a plastic material and is formed by injecting a plastic molding material between the upper metal plate 110 and the lower metal plate 120.

The protective cover 250 is also formed by the plastic molding used to form the insulator 230 and has a lens attachment unit 251 for receiving the lens 260 thereon. The protective cover 250 and the insulator 230 may be formed by plastic molding as an integrated single body. The lens 260 is bonded on the lens attachment unit 251 by an adhesive. Epoxy resin can be applied on the surface of the lens attachment unit 251 to seal the gap between the lens 260 and the protective cover 250.

A method of fabricating the LED package 200 according to the second exemplary embodiment of the present invention will be described below.

First, as stated above with reference to FIG. 5A and FIG. 5B, upper metal plates 110 and lower metal plates 120 are formed by processing an upper substrate 20 and a lower substrate 30, respectively.

Figure 8A:
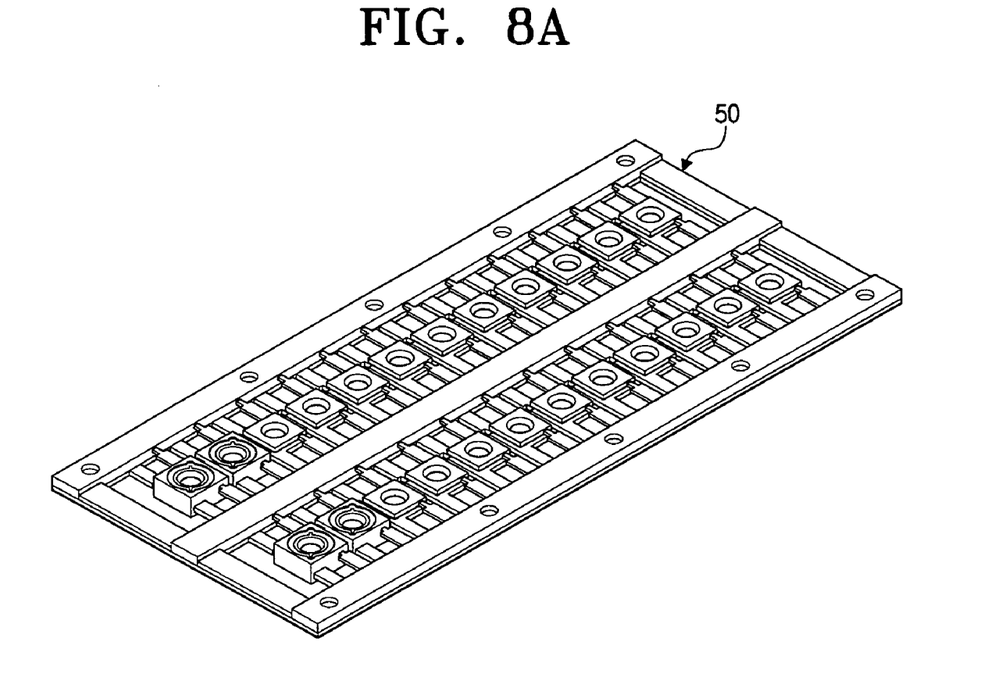
FIG. 8A to FIG. 8C are schematic views of a fabrication method of the LED package shown in FIG. 6 and FIG. 7.
Figure 8B:
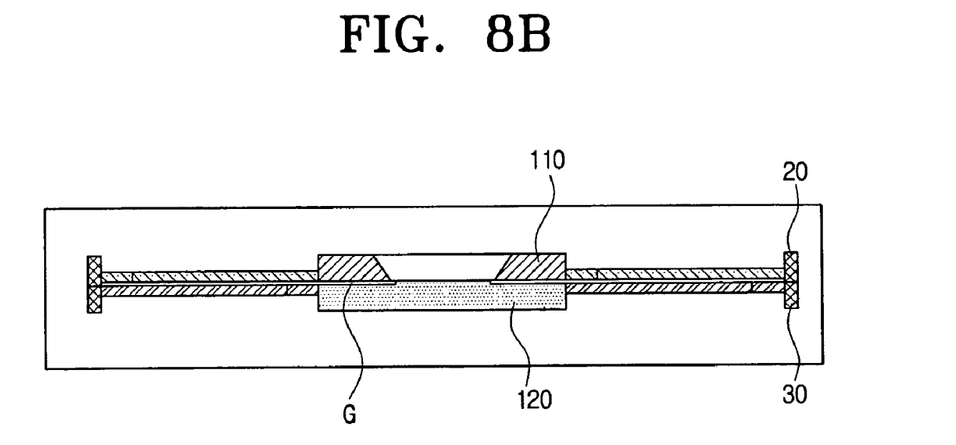
Figure 8C:
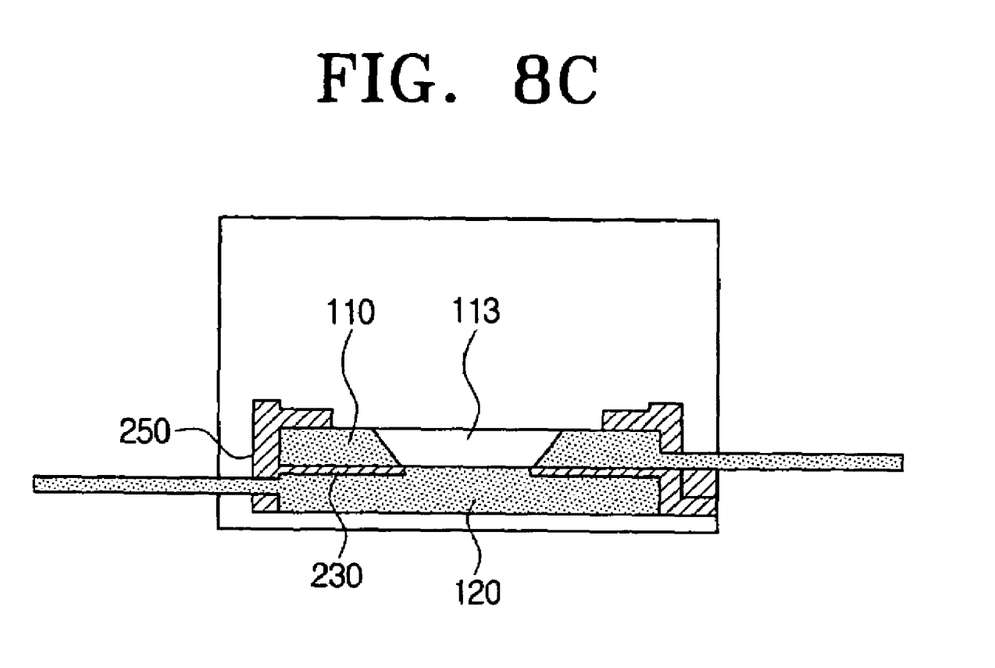

Next, as illustrated in FIG. 8A, the upper substrate 20 and the lower substrate 30 are positioned to face to each other and are combined, so that a substrate assembly 50 is formed. At this time, unlike in the method described with reference to FIG. 5C, an insulator, i.e. a polymer film, is not interposed between the substrates 20 and 30. Rather, when the substrate assembly 50 is prepared, as illustrated in FIG. 8B, a gap G of a predetermined size is left between the upper metal plates 110 and the lower metal plates 120. Then, the gap G is filled with a plastic material when the exterior of the upper and lower metal plates 110 and 120 are encapsulated by a plastic molding method. As a result, as shown in FIG. 8C, the insulator 230 and the protective cover 250 are integrated into a single body. As described above, if the insulator 230 and the protective cover 250 are formed simultaneously as an integrated single body, the LED package fabrication time can be reduced and a bonding force between the upper metal plate 110 and the lower metal plate 120 is enhanced.

Next, via the LED receiving hole 113, an LED 140 is mounted on a part of the lower metal plate which is not covered by the protective cover 250. Then, a lens 260 is attached on a lens attachment unit 251 of the protective cover 250 and the packaging process of the LED package 20.

Predetermined portions of the substrate assembly 50 are cut out and thus the LED packages 200, with first and second leads 112 and 122 exposed to the outside of the protective cover 250, are produced in large volumes as illustrated in FIG. 6 and FIG. 7.

According to the first and second exemplary embodiments of the present invention, in the LED packages 100 and 200 in which the LED 140 is directly and electrically connected to the lower metal plate 120 via solder 141 and connected to the upper metal plate 110 by a wire 143, only the vertical type of LEDs are exemplified. However, other types of LEDs can also be packaged according to the methods of the present invention.

Figure 9:
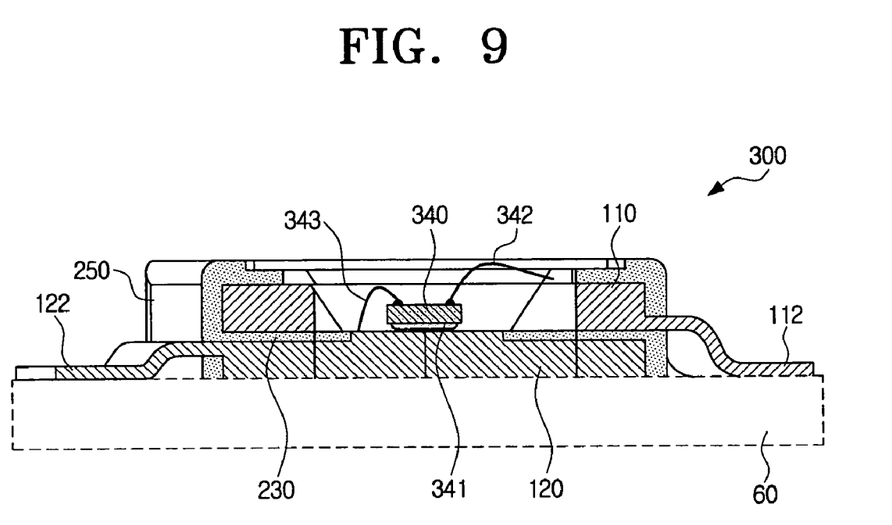
FIG. 9 is a cross-sectional view of an LED package according to a third exemplary embodiment of the present invention.

As illustrated in FIG. 9, an LED package 300, employing a lateral type of LED 340, can be realized by a method of the present invention. In this case, the LED 340 is bonded to the lower metal plate 120 by solder 341 and is connected to the metal plates 110 and 120 by conductive wires 342 and 343. In FIG. 9, like elements which are the same as in the LED package 200 described with reference to FIG. 6 and FIG. 7 are denoted by like reference numerals, and thus detailed description on like elements of the LED package 300 will be omitted. Reference numeral 60 designates a board on which the LED package 300 is mounted. Since a lower metal plate 120 is closely adhered to the board 60, heat transfer and radiation effects are enhanced. Further, leads 112 and 122 of metal plates 110 and 120, respectively, are electrically connected to electrode pads (not shown) provided on the surface of the board 60.

Figure 10:
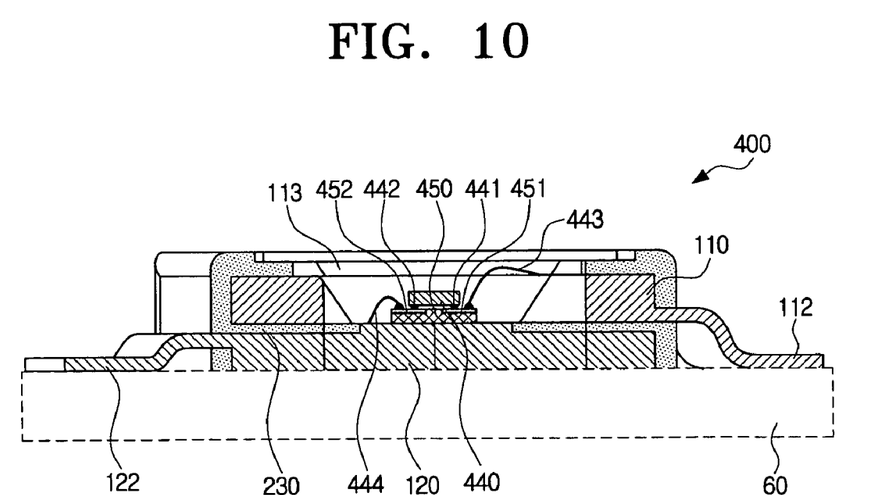
FIG. 10 is a cross-sectional view of an LED package according to a fourth exemplary embodiment of the present invention.

As illustrated in FIG. 10, an LED 440 may be a flip-chip type in which electrodes are provided on the bottom surface thereof. In this case, a sub-mount 450 is provided on the part of the lower metal plate 120 which is exposed through the LED receiving hole 113. This sub-mount 450 has a first electrode 451 and a second electrode 452, which are insulated from each other, on one surface thereof. Accordingly, the LED 440 connected to the first and second electrodes 451 and 452 is bonded by a first solder 441 and a second solder 442. The first and second electrodes 451 and 452 are electrically connected to the upper and lower metal plates 110 and 120 by wires 443 and 444, respectively.

Figure 11:
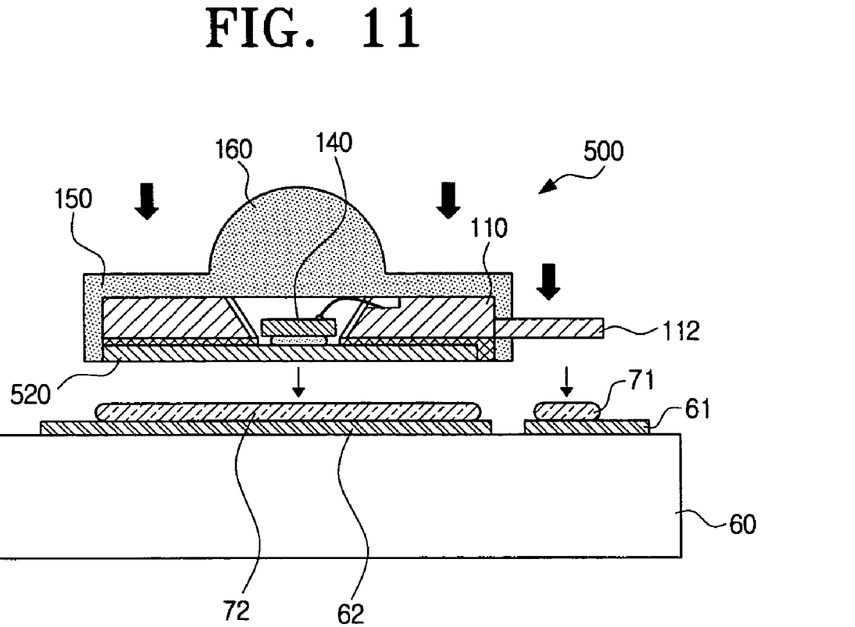
FIG. 11 is a cross-sectional view of an LED package according to a fifth exemplary embodiment of the present invention.

In the above-described embodiment, the structure in which the upper and lower metal plates 110 and 120 are formed as integrated bodies with the leads 112 and 122, respectively, is merely exemplary. That is, a lead or leads can be provided to either or both of the upper metal plate 110 and the lower metal plate 120. As illustrated in FIG. 11, a lead 112 may be provided to only the upper metal plate 110 and may project through the protective cover 150. That is, it is possible that a lead is not provided to the lower metal plate 520. In this case, when LED package 500 is mounted on a board 60, the lead 112 of the upper metal layer 110 is electrically connected, via solder, to a first electrode pad 61 provided on the board 60. The lower metal plate 530 can be electrically connected to a second electrode pad 62 provided on the board 60 via solder 72. That is, since the lower metal plate 520 is directly and electrically connected to the second electrode pad 62 on the board 60, the LED package can have a simple structure and thus its assembly is simplified. Since the heat of the lower metal plate 520 is transferred via the solder 72 and the second electrode pad 62, heat transfer efficiency and heat dissipation performance are enhanced.

Figure 12:
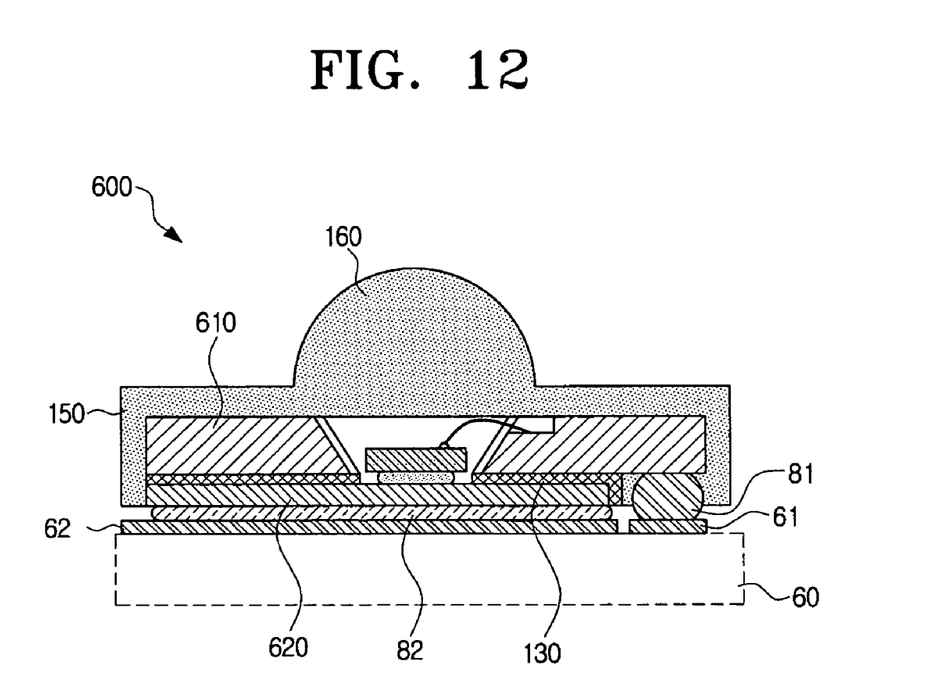
FIG. 12 is a cross-sectional view of an LED package according to a sixth exemplary embodiment of the present invention.

Referring to FIG. 12, in the structure in which an upper metal plate 610 and a lower metal plate 620 are insulated from each other by an insulator 130, the bottom surface of the upper metal plate 610 can be directly connected to the first electrode pad 61 of the board 60 via a solder bump 81. It is also possible that the bottom surface of the lower metal plate 620 is electrically connected to the second electrode pad 62 of the board 60 by solder 82. According to the structure above, the upper metal plate 610 and the lower metal plate 620 can be directly and electrically connected to the electrode pads 61 and 62 respectively, while the upper metal plate 610 and the lower metal plate 620 are separated by the insulator 130, without using leads. Accordingly, such structure is advantageous in that it has a simple configuration and includes a smaller number of parts compared to conventional structures. Accordingly, the fabrication process is simplified, production cost is reduced, and productivity is increased.

As described above, according to a fabrication method of the present invention, an LED package having enhanced heat dissipation performance and a thin, small structure can be produced. Consequently, it is easy to implement a high power LED package used as a backlight unit of an LCD or in lighting systems.

The total thickness of an LED package can be reduced by forming an upper metal plate and a lower metal plate, serving as electrodes, separated by an insulator, thereby enhancing the heat sinking efficiency.

Further, since upper and lower metal plates serve as electrodes of an LED, additional electrodes are not needed. As a result, fabrication processes and assembling processes of an LED package are simplified.

While the invention has been shown and described with reference to exemplary embodiments thereof, it will be understood by those skilled in the art that various changes in form and details may be made therein without departing from the spirit and scope of the invention as defined by the appended claims.

What is claimed is:

1. A light emitting diode (LED) package, comprising:
an upper metal plate having an LED-receiving hole;
a lower metal plate mounted to a lower surface of the upper metal plate via an insulator disposed therebetween, wherein a portion of the lower metal plate is exposed via the LED-receiving hole in the upper metal plate;
an LED mounted on the exposed portion of the lower metal plate and electrically connected to the upper and lower metal plates; and
a protective cover which encloses exposed surfaces of the upper and lower metal plates,
wherein the LED is mounted on the exposed portion of the lower metal plate via a sub-mount,
wherein the sub-mount comprises a first electrode and a second electrode;
wherein the first and second electrodes are soldered to the LED; and
wherein the first electrode is connected to the upper metal plate via at least one first wire and the second electrode is connected to the lower metal plate via at least one second wire.

2. The LED package according to claim 1, wherein at least one of the upper metal plate and the lower metal plate includes a lead extending from a side thereof wherein the lead forms an integrated single body together with the corresponding metal plate.

3. The LED package according to claim 2, wherein the lead projects through the protective cover.

4. The LED package according to claim 1, wherein
the upper metal plate includes a first lead extending from a side thereof, wherein the first lead forms an integrated single body together with the upper metal plate, and
the lower metal plate includes a second lead extending from a side thereof, wherein the second lead forms an integrated single body together with the lower metal plate.

5. The LED package according to claim 1, further comprising a lens mounted on the upper metal plate.

6. The LED package according to claim 5, wherein the protective cover and the lens are formed as an integrated single body.

7. The LED package according to claim 1, wherein the upper and lower metal plates are made of aluminum (Al) or copper (Cu).

8. The LED package according to claim 1, wherein an inner circumference of the LED-receiving hole becomes larger from the lower surface to an upper surface of the upper metal plate, and a reflective coating layer is disposed on an inner circumferential surface of the LED-receiving hole.

9. The LED package according to claim 1, wherein the insulator adheres the upper metal plate to the lower metal plate and includes a penetration hole disposed in a position corresponding to a position of the LED receiving hole.

10. The LED package according to claim 9, wherein the insulator comprises a polymer film.

11. The LED package according to claim 1, wherein the insulator comprises a plastic material.

12. The LED package according to claim 11, wherein the insulator is formed by injecting a plastic mold material into a gap between the upper and lower metal plates.

13. The LED package according to claim 1, wherein the insulator and the protective cover are formed by a plastic molding method.

* * * * *